United States Patent
Zhang et al.

(10) Patent No.: US 11,860,393 B2
(45) Date of Patent: Jan. 2, 2024

(54) FLEXIBLE TOUCH DISPLAY MODULE AND TOUCH DISPLAY DEVICE INCLUDING THE SAME

(71) Applicant: BOE Technology Group Co., Ltd., Beijing (CN)

(72) Inventors: Xiongnan Zhang, Beijing (CN); Paoming Tsai, Beijing (CN); Haoran Wang, Beijing (CN); Ziang Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/922,068

(22) PCT Filed: Oct. 22, 2021

(86) PCT No.: PCT/CN2021/125609
§ 371 (c)(1),
(2) Date: Oct. 28, 2022

(87) PCT Pub. No.: WO2022/134816
PCT Pub. Date: Jun. 30, 2022

(65) Prior Publication Data
US 2023/0168419 A1 Jun. 1, 2023

(30) Foreign Application Priority Data

Dec. 23, 2020 (CN) .......................... 202011540011.0

(51) Int. Cl.
*G02B 5/30* (2006.01)
*H10K 59/40* (2023.01)
(Continued)

(52) U.S. Cl.
CPC ......... *G02B 5/3016* (2013.01); *G02B 5/3025* (2013.01); *H10K 59/40* (2023.02); *H10K 59/871* (2023.02); *H10K 2102/311* (2023.02)

(58) Field of Classification Search
CPC .... G02B 5/3016; G02B 5/3025; H10K 59/40; H10K 59/871
See application file for complete search history.

(56) References Cited

FOREIGN PATENT DOCUMENTS

| CN | 102272814 A | 12/2011 |
|---|---|---|
| CN | 105742319 A | 7/2016 |

(Continued)

OTHER PUBLICATIONS

First Office Action dated Jun. 1, 2021 corresponding to Chinese application No. 202023163178.8.

*Primary Examiner* — Joseph L Williams
(74) *Attorney, Agent, or Firm* — Nath, Goldberg & Meyer; Joshua B. Goldberg

(57) ABSTRACT

A flexible touch display module (100) and a touch display device (1000) including the flexible touch display module, the flexible touch display module (100) includes: a flexible display panel (1), a flexible cover plate (2), a linear polarization layer (3), a first retardation plate (4) and a second retardation plate (5). An absorption axis of the linear polarization layer (3) is at an angle of about 90°. The first retardation plate (4) includes a first retardation film (41), and the first retardation film (41) is a liquid crystal layer having a quarter-wavelength retardation. The first retardation film (41) has a major axis and a minor axis in a plane parallel to flexible display panel (1), and an included angle between a direction in which the minor axis of the first retardation film (41) extends and the absorption axis of the linear polarization layer (3) is about 45°.

20 Claims, 3 Drawing Sheets

(51) Int. Cl.
*H10K 59/80* (2023.01)
*H10K 102/00* (2023.01)

(56) References Cited

FOREIGN PATENT DOCUMENTS

| | | |
|---|---|---|
| CN | 107735704 A | 2/2018 |
| CN | 107978689 A | 5/2018 |
| CN | 108663851 A | 10/2018 |
| CN | 109494239 A | 3/2019 |
| CN | 109712534 A | 5/2019 |
| CN | 10073723 A | 7/2019 |
| CN | 110959307 A | 4/2020 |
| CN | 111670393 A | 9/2020 |

FLEXIBLE TOUCH DISPLAY MODULE AND TOUCH DISPLAY DEVICE INCLUDING THE SAME

CROSS REFERENCE TO RELATED APPLICATIONS

This is a National Phase Application filed under 35 U.S.C. 371 as a national stage of PCT/CN2021/125609, filed Oct. 22, 2021, an application claiming the benefit of Chinese patent application No. 202011540011.0 filed on Dec. 23, 2020, the entire contents of each of which are incorporated herein by reference.

TECHNICAL FIELD

The present disclosure relates to the field of display technology, and in particular to a flexible touch display module and a touch display device including the flexible touch display module.

BACKGROUND

A flexible touch display module in the related art adopts a flexible hard cover plate and a polarizer. Since the polarizer is composed of a plurality of films such as a polyvinyl alcohol (PVA) film and a triacetyl cellulose (TAC) film, an overall thickness of the flexible touch display module is relatively large, where a total thickness obtained by stacking the flexible hard cover plate and the polarizer is about 300 µm or more, therefore a bending performance of the flexible touch display module is greatly limited. Moreover, the flexible touch display module in the related art is prone to cracks in a direction of an absorption axis during a reliability test. In addition, in an outdoor scene under ambient light, if a user wearing sunglasses watches the flexible touch display module in the related art, the user may observe that the flexible touch display module is seriously dark at a certain angle, and cannot be seen clearly.

SUMMARY

The present disclosure is directed to solving at least one of problems in the related art. Therefore, the present disclosure provides a flexible touch display module, which has a relatively small thickness, good flexiblility, good tensile resistance property and a sunglassesfree function.

The present disclosure further provides a touch display device including the flexible touch display module mentioned above.

In a first aspect, an embodiment of the present disclosure provides a flexible touch display module including: a flexible display panel; a flexible cover plate disposed on a display side of the flexible display panel; a linear polarization layer disposed between the flexible display panel and the flexible cover plate, with an absorption axis of the linear polarization layer being at an angle of about 90°; a first retardation plate including a first retardation film between the linear polarization layer and the flexible cover plate, the first retardation film being a liquid crystal layer with a quarter-wavelength retardation and having a major axis and a minor axis in a plane parallel to the flexible display panel, where an included angle between a direction in which the minor axis of the first retardation film extends and the absorption axis of the linear polarization layer is about 45°; and a second retardation plate disposed between the linear polarization layer and the flexible display panel.

The flexible touch display module according to the embodiment of the present disclosure has a relatively small thickness, good flexiblility, good tensile resistance property and a sunglassesfree function.

In some implementations, the flexible cover plate is of a single-layer or multi-layer structure, and a material of the flexible cover plate includes one or a combination of two or more of polyimide, polyethylene terephthalate, polycarbonate, polyarylester, polyethersulfone, polyethylene naphthalate, fiber reinforced plastic, ultrathin glass, or polydodecyl methacrylate.

In some implementations, the linear polarization layer includes at least one of an iodine-based polarizing film or a dye-based polarizing film.

In some implementations, the first retardation plate further includes a second retardation film disposed between the first retardation film and the linear polarization layer, the second retardation film being a liquid crystal layer with a half-wavelength retardation and having a major axis and a minor axis in a plane parallel to the flexible display panel.

In some implementations, the second retardation plate includes a third retardation film having a major axis and a minor axis in a plane parallel to the flexible display panel, the third retardation film being a liquid crystal layer with a quarter-wavelength retardation.

In some implementations, the second retardation plate further includes a fourth retardation film disposed between the third retardation film and the linear polarization layer, the fourth retardation film being a liquid crystal layer with a half-wavelength retardation and having a major axis and a minor axis in a plane parallel to the flexible display panel.

In some implementations, an included angle between a direction in which the minor axis of the fourth retardation film extends and the absorption axis of the linear polarization layer is a1, and a1=15°±5°, and an included angle between a direction in which the minor axis of the third retardation film extends and the absorption axis of the linear polarization layer is a2, and a2=2a1+45°.

In some implementations, the first retardation plate is bonded to the flexible cover plate, and/or the first retardation plate is bonded to the linear polarization layer.

In some implementations, the second retardation film is bonded to the flexible display panel, and/or the second retardation film is bonded to the linear polarization layer.

In some implementations, the flexible touch display module includes the flexible cover plate, a first adhesive layer, the first retardation film, a second adhesive layer, the linear polarization layer, a third adhesive layer, the third retardation film, a fourth adhesive layer and the flexible display panel, which are sequentially arranged from the display side to an non-display side.

In some implementations, the flexible touch display module includes the flexible cover plate, a first adhesive layer, the first retardation film, a second adhesive layer, the linear polarization layer, a third adhesive layer, the fourth retardation film, the third retardation film, a fourth adhesive layer and the flexible display panel, which are sequentially arranged from the display side to an non-display side.

In a second aspect, an embodiment of the present disclosure provides a touch display device, including the flexible touch display module according to the embodiment of the present disclosure in the first aspect.

The touch display device according to the embodiment of the present disclosure is provided with the flexible touch display module according to the embodiment of the present disclosure in the first aspect, and thus has a relatively small thickness, good flexiblility, good tensile resistance property and a sunglassesfree function.

Additional aspects and advantages of the present disclosure will be given in the following description, and part of them will become obvious from the following description, or will be learned from practices of the present disclosure.

Figure 1:
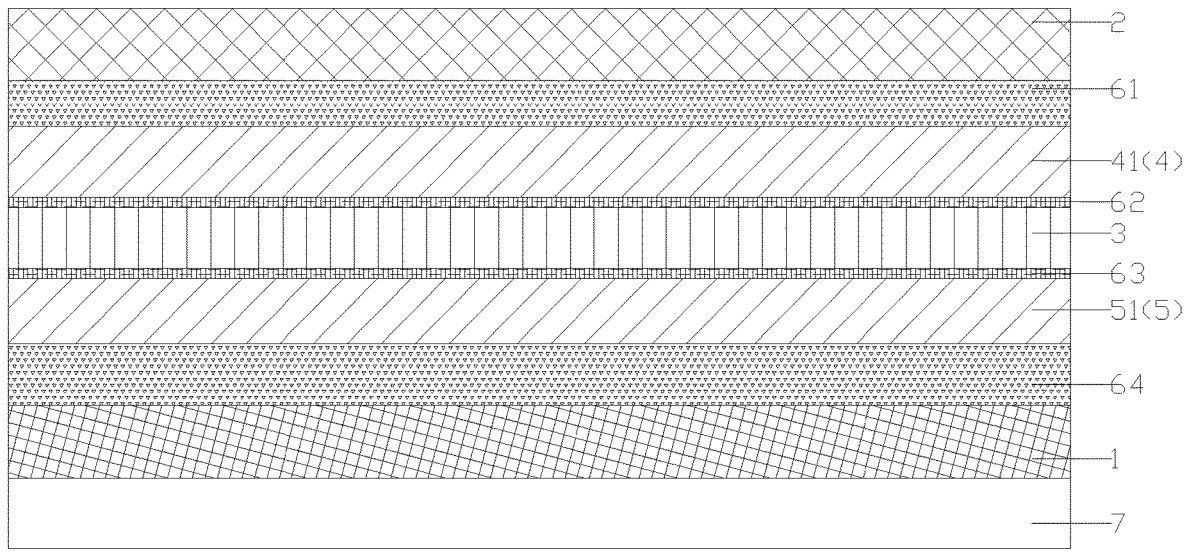
FIG. 1 is a schematic cross-sectional view of a flexible touch display module according to an embodiment of the present disclosure.

REFERENCE NUMERALS 1000, touch display device; 100, flexible touch display module;
1, flexible display panel; 2, flexible cover plate; 3, linear polarization layer;
4, first retardation plate; 41, first retardation film; 42, second retardation film;
5, second retardation plate; 51, third retardation film; 52, fourth retardation film;
61, first adhesive layer; 62, second adhesive layer; 63, third adhesive layer;
64, fourth adhesive layer; 7, back support member.

DETAILED DESCRIPTION OF EMBODIMENTS

Embodiments of the present disclosure will be described in detail below. Examples of the embodiments are shown in the drawings, in which like or similar reference numerals represent the like or similar elements or elements with the like or similar functions throughout. The embodiments described below with reference to the drawings are exemplary and are intended to explain the present disclosure, but should not be construed as limiting the present disclosure.

The following description provides many different implementations or examples for implementing different structures of the present disclosure. To simplify the description of the present disclosure, components and configurations in particular examples are described below. Certainly, these examples are merely exemplary and are not intended to limit the present disclosure. Further, reference numerals and/or letters may be used reapeatedly in the various examples. Such repetition is for the purpose of simplicity and clarity and does not indicate a relationship between the various examples and/or the configurations. In addition, examples of various processes and materials are provided herein, but one of ordinary skill in the art may recognize that other processes and/or other materials may be applied.

A flexible touch display module in the related art adopts a flexible hard cover plate and a polarizer. Since the polarizer is composed of a plurality of films such a polyvinyl alcohol (PVA) film and a triacetyl cellulose (TAC) film, an overall thickness of the flexible touch display module is relatively thick, where a total thickness obtained by stacking the flexible hard cover plate and the polarizer is about 300 μm or more, a bending performance of the flexible touch display module is greatly limited. Moreover, the flexible touch display module in the related art is prone to cracks in a direction of an absorption axis during a reliability test. In addition, in an outdoor scene under ambient light, if a user wearing sunglasses watches the flexible touch display module in the related art, the user may observe that the flexible touch display module is seriously dark at a certain angle, and cannot be seen clearly. In order to solve at least one of above technical problems, the present disclosure provides a flexible touch display module 100 and a touch display device 1000 including the flexible touch display module.

The flexible touch display module 100 according to an embodiment of the present disclosure in a first aspect is described below with reference to the drawings.

As shown in FIG. 1, the flexible touch display module 100 includes a flexible display panel 1, a flexible cover plate 2, a linear polarization layer 3, a first retardation plate 4 and a second retardation plate 5. The flexible cover plate 2 is disposed on a display side of the flexible display panel 1, the linear polarization layer 3 is disposed between the flexible display panel 1 and the flexible cover plate 2, the first retardation plate 4 is disposed between the linear polarization layer 3 and the flexible cover plate 2, and the second retardation plate 5 is disposed between the linear polarization layer 3 and the flexible display panel 1. In other words, the flexible display panel 1, the second retardation plate 5, the linear polarization layer 3, the first retardation plate 4, and the flexible cover plate 2 are sequentially disposed in a direction from a non-display side to the display side.

In the embodiment of the present disclosure, the "linear polarization layer 3" refers to a highly oriented polymer film having a linear polarizing function, for example, may be made by taking polyvinyl alcohol (PVA) as a base material to adsorb a dichroic dye. Therefore, in the present disclosure, a thickness of the flexible touch display module 100 may be reduced by combining the linear polarization layer 3 and the flexible cover plate 2 to replace a combination of the flexible hard cover plate and the polarizer in the related art, which is helpful to realize flexible bending of the flexible touch display module 100.

Integration

In the embodiment of the present disclosure, an absorption axis of the linear polarization layer 3 is at an angle of about 90°, it should be noted that, for the flexible touch display module 100 in a shape of a rectangular, a direction in which a short side of the flexible touch display module extends is parallel to a direction in which a folding line extends, in response to that the direction in which the folding line extends is defined as a direction at an angle of about 0°, the absorption axis of the linear polarization layer 3 is at an angle of about 90°, which indicates that the direction in which the absorption axis of the linear polarization layer 3 extends is perpendicular to the direction in which the folding line extends, or the direction in which the absorption axis of the linear polarization layer 3 extends is parallel to a direction in which a long side of the flexible touch display module 100 extends. With such configurations, the flexible touch display module 100 can have better tensile resistance property, the problem that the flexible touch display module 100 is prone to cracks in the direction, in which the absorption axis extends, during the flexible touch display module 100 being bent can be improved or avoided, that is, the flexible touch display module 100 can have good mechanical bendable characteristic.

Figure 6:
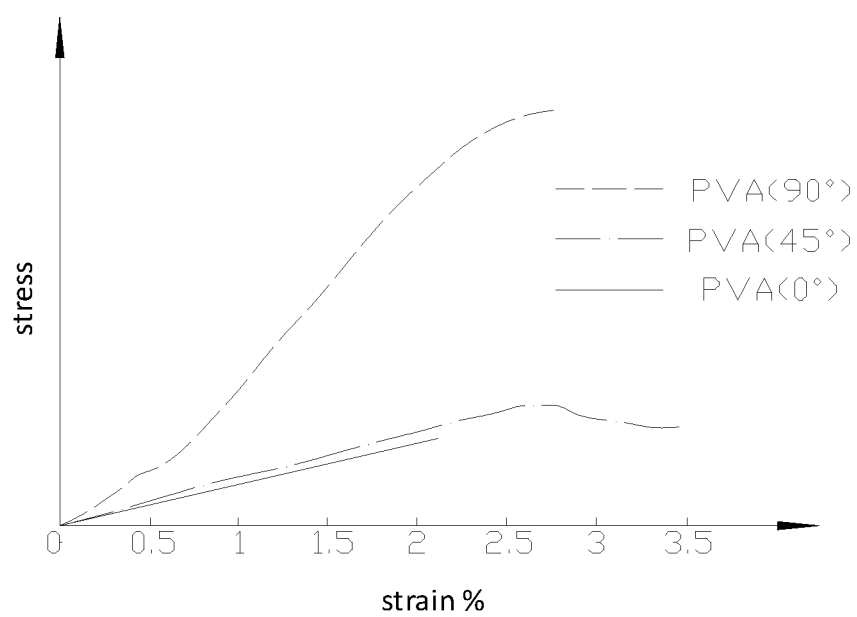
FIG. 6 is a strain-stress graph of an absorption axis of a linear polarization layer at different angles according to an embodiment of the present disclosure.

For example, as shown in FIG. 6, a stress comparison graph is illustrated for the linear polarization layer 3 being a PVA film with the absorption axis is at angles of about 0°, 45°, and 90°, respectively, and it can be seen that if the absorption axis of the linear polarization layer 3 is at the angle of about 90°, the flexible touch display module 100 has better stretch resistance property. Further, by making the absorption axis of the linear polarization layer 3 at the angle of about 90°, compared with making the absorption axis at other angles, it is favorable to cutting out the linear polarization layer 3, and can cut out more linear polarisation layers 3 from a same-sized linear polarization mother film, therefore a utilization rate of material of the flexible touch display module 100 can be improved, the cost of material can be reduced, and the number of processes can be reduced.

In the embodiment of the present disclosure, as shown in FIG. 1, the first retardation plate 4 includes a first retardation film 41, the first retardation film 41 is a liquid crystal layer having a quarter-wavelength retardation (phase delay), i.e., a quarter-wavelength retardation would be generated after a light wave passing through the first retardation film 41, the first retardation film 41 has a major axis and a minor axis in a plane parallel to the flexible display panel 1, and in response to that the absorption axis of the linear polarization layer 3 is at the angle of about 90°, an included angle between a direction in which the minor axis of the first retardation film 41 extends and the absorption axis of the linear polarization layer 3 is about 45°. With such configurations, the flexible touch display module 100 may have a sunglassfree function, that is, in an outdoor scene under ambient light, a phenomenon that a user wearing sunglasses cannot see the flexible touch display module clearly at a certain angle due to serious darkness of the flexible touch display module is avoided.

As above, the flexible touch display module 100 according to the embodiment of the present disclosure has a relatively small thickness, good flexibility, low cost of material, better tensile resistance property and a sunglassfree function, and is easy to be manufactured.

In some implementations, the flexible cover plate 2 is of a single-layer or multi-layer structure. For example, a material of the flexible cover plate 2 includes one or a combination of two or more of polyimide, polyethylene terephthalate, polycarbonate, polyarylester, polyethersulfone, polyethylene naphthalate, fiber reinforced plastic, ultrathin glass, or polydodecyl methacrylate. With such configurations, the flexible cover plate 2 has better flexibility and protective performance. Certainly, the present disclosure is not limited thereto, and in other implementations, the flexible cover plate 2 may be made of other materials, which are not described herein. It will be appreciated that, in order to ensure a display effect, the flexible cover plate 2 is transparent.

In some implementations, the linear polarization layer 3 includes at least one of an iodine-based polarizing film and a dye-based polarizing film, where the iodine-based polarizing film may be made, for example, by taking polyvinyl alcohol (PVA) as a base material to adsorb dye including iodine. With such configurations, the linear polarization layer has a good linear polarization performance, and the flexible touch display module 100 is ensured to have good flexibility. Certainly, the present disclosure is not limited thereto, and in other implementations, the linear polarization layer 3 may be made of other materials, which are not described herein.

Figure 2:
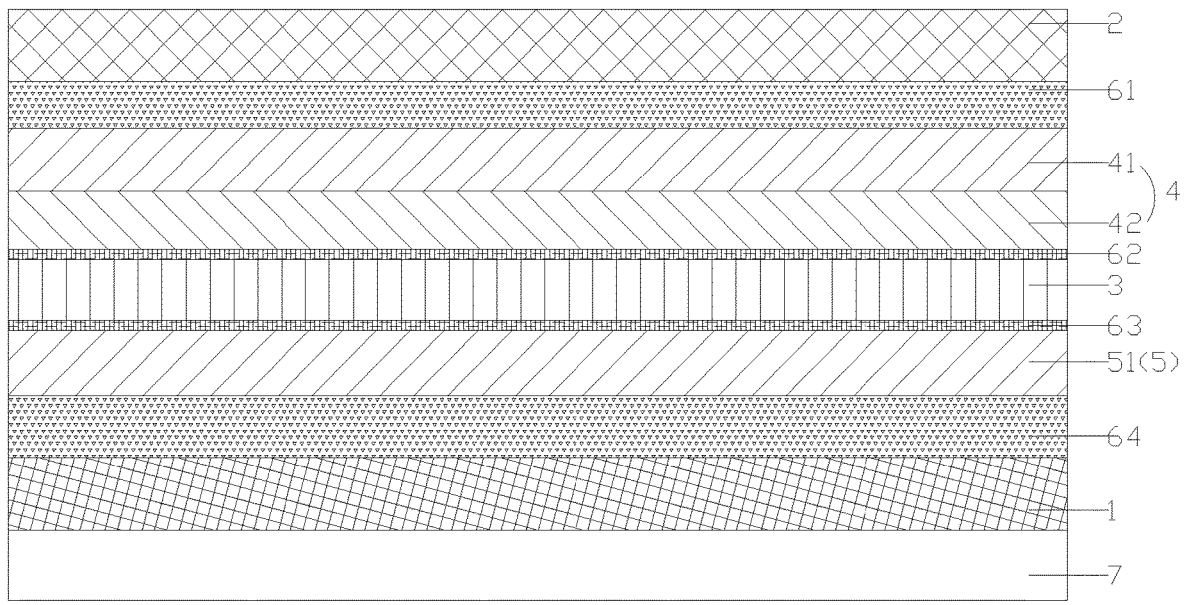
FIG. 2 is a schematic cross-sectional view of a flexible touch display module according to an embodiment of the present disclosure.

In some implementations, as shown in FIG. 2, the first retardation plate 4 further includes a second retardation film 42, the second retardation film 42 is a liquid crystal layer having an one-half wavelength retardation, the second retardation film 42 has a major axis and a minor axis in a plane parallel to the flexible display panel 1, the second retardation film 42 is located between the first retardation film 41 and the linear polarization layer 3. That is, the second retardation film 42 is disposed between the first retardation film 41 and the linear polarization layer 3, and an one-half wavelength retardation would be generated after a light wave passing through the second retardation film 42. With such configurations, a better anti-reflection function for the light emitting from the non-display side to the display side can be achieved, and it can be guaranteed that the flexible touch display module 100 has good flexibility.

In some implementations, as shown in FIG. 2, the second retardation plate 5 includes a third retardation film 51, the third retardation film 51 is a liquid crystal layer having a quarter-wavelength retardation, the third retardation film 51 has a major axis and a minor axis in a plane parallel to the flexible display panel 1. That is, the third retardation film 51 is disposed between the flexible display panel 1 and the linear polarization layer 3, and a quarter-wavelength retardation would be generated after a light wave passing through the third retardation film 51. With such configurations, a conversion from a linear polarization to a circle polarization can be realized, and a certain anti-reflection function for the light emitting from the display side to the non-display side can be achieved, and it can be guaranteed that flexible touch display module assembly 100 has good flexibility.

Figure 3:
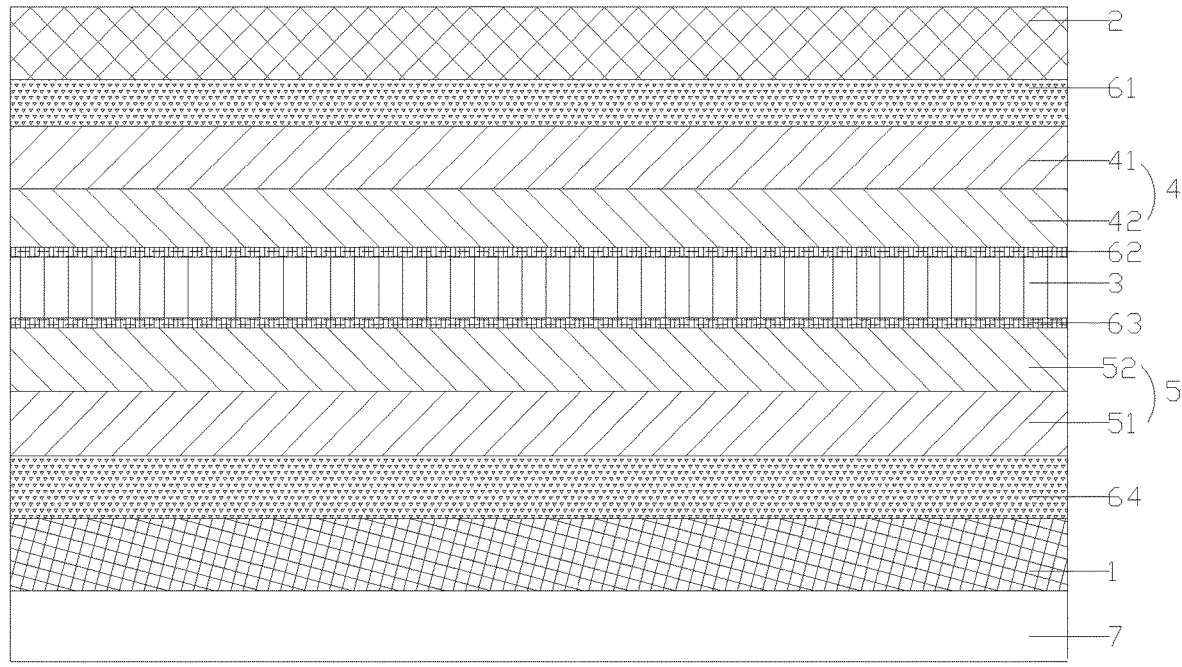
FIG. 3 is a schematic cross-sectional view of a flexible touch display module according to an embodiment of the present disclosure.

In some implementations, as shown in FIG. 3, the second retardation plate 5 includes a fourth retardation film 52, the fourth retardation film 52 is a liquid crystal layer having an one-half wavelength retardation, the fourth retardation film 52 has a major axis and a minor axis in a plane parallel to the flexible display panel 1, the fourth retardation film 52 is located between the third retardation film 51 and the linear polarization layer 3. That is, the fourth retardation film 52 is disposed between the third retardation film 51 and the linear polarization layer 3, and an one-half wavelength retardation would be generated after a light wave passing through the fourth retardation film 52. With such configurations, a better anti-reflection function for the light emitting from the display side to the non-display side can be achieved, and it can be guaranteed that the flexible touch display module 100 has good flexibility.

In some implementations, an included angle between a direction in which the minor axis of the fourth retardation film 52 extends and the absorption axis of the linear polarization layer 3 is a1, and a1=15°±5°, and an included angle between a direction in which the minor axis of the third retardation film 51 extends and the absorption axis of the linear polarization layer 3 is a2, and a2=2a1+45°. That is, an acute angle a1 is formed between the direction in which the absorption axis of the linear polarization layer 3 extends and the direction in which the minor axis of the fourth retardation film 52 extends, and an angle a2 is formed between the direction in which the absorption axis of the linear polarization layer 3 extends and the direction in which the minor axis of the third retardation film 51 extends, where $10°≤a1≤20°$ and a2=2a1+45°. Therefore, a better anti-reflection function for the light emitting from the display side to the non-display side can be achieved.

In some implementations, the first retardation plate 4 is bonded to the flexible cover plate 2. For example, as shown in FIG. 1, the first retardation plate 4 is bonded to the flexible cover plate 2 by a first adhesive layer 61, that is, only the first adhesive layer 61 is provided between the first retardation plate 4 and the flexible cover plate 2, and no other film layer is further provided between the first retardation plate 4 and the flexible cover plate 2, so as to effectively prevent cracks or the like from occurring during a process of bending, ensure a connection reliability, and improve a practical effect of flexibility of the flexible touch display module 100. For example, the first adhesive layer 61 may be made of pressure sensitive adhesive or the like.

In some implementations, the first retardation plate 4 is bonded to the linear polarization layer 3. For example, as shown in FIG. 1, the first retardation plate 4 is bonded to the linear polarization layer 3 by a second adhesive layer 62, that is, only the second adhesive layer 62 is provided between the first retardation plate 4 and the linear polarization layer 3, and no other film layer is further provided between the first retardation plate 4 and the linear polarization layer 3, so as to effectively prevent cracks or the like from occurring during a process of bending, ensure a connection reliability, and improve a practical effect flexibility of the flexible touch display module 100. For example, the second adhesive layer 62 may be made of nano-adhesive or the like.

In some implementations, the second retardation plate 5 is bonded to the linear polarization layer 3. For example, as shown in FIG. 1, the second retardation plate 5 is bonded to the linear polarization layer 3 by a third adhesive layer 63, that is, only the third adhesive layer 63 is provided between the second retardation plate 5 and the linear polarization layer 3, and no other film layer is further provided between the second retardation plate 5 and the linear polarization layer 3, so as to effectively prevent cracks or the like from occurring during a process of bending, ensure a connection reliability, and improve a practical effect of flexibility of the flexible touch display module 100. For example, the third adhesive layer 63 may be made of nano-adhesive or the like.

In some implementations, the second retardation plate 5 is bonded to the flexible display panel 1. For example, as shown in FIG. 1, the second retardation plate 5 is bonded to the flexible display panel 1 by a fourth adhesive layer 64, that is, only the fourth adhesive layer 64 is provided between the second retardation plate 5 and the flexible display panel 1, and no other film layer is further provided between the second retardation plate 5 and the flexible display panel 1, so as to effectively prevent cracks or the like from occurring during a process of bending, ensure a connection reliability, and improve a practical effect of flexibility of the flexible touch display module 100. For example, the fourth adhesive layer 64 may be made of pressure sensitive adhesive or the like.

In a process for manufacturing the flexible touch display module in the related art, it is necessary to add a process for bonding the flexible hard cover plate to the polarizer, resulting in a complicated process and low stability and yield of products. For the flexible touch display module in the embodiment of the present disclosure, it is unnecessary to provide the polarizer, and the linear polarization layer 3 may be simply bonded to a desired position by using a bonding technique so as to manufacture the flexible touch display module, and thus the difficulty of manufacturing is reduced, and the stability and yield of products are improved.

In some implementations, the flexible cover plate 2, the first adhesive layer 61, the first retardation plate 4, the second adhesive layer 62, the linear polarization layer 3, the third adhesive layer 63, the second retardation plate 5 and the fourth adhesive layer 64 may form an integrated module, which as a whole is bonded to the flexible display panel 1, thereby improving production efficiency.

Certainly, the present disclosure is not limited hereto, and processes such as spraying may be adopted instead of bonding, which is not described herein.

As described above, the flexible touch display module 100 according to the embodiment of the present disclosure in the first aspect may be implemented as at least following four examples.

In a first example, as shown in FIG. 1, the flexible touch display module 100 includes the flexible cover plate 2, the first adhesive layer 61, the first retardation film 41, the second adhesive layer 62, the linear polarization layer 3, the third adhesive layer 63, the third retardation film 51, the fourth adhesive layer 64 and the flexible display panel 1, which are sequentially disposed from top to bottom.

In a second example, as shown in FIG. 2, the flexible touch display module 100 includes the flexible cover plate 2, the first adhesive layer 61, the first retardation film 41, the second retardation film 42, the second adhesive layer 62, the linear polarization layer 3, the third adhesive layer 63, the third retardation film 51, the fourth adhesive layer 64 and the flexible display panel 1, which are sequentially disposed from top to bottom.

In a third example, as shown in FIG. 3, the flexible touch display module 100 includes the flexible cover plate 2, the first adhesive layer 61, the first retardation film 41, the second retardation film 42, the second adhesive layer 62, the linear polarization layer 3, the third adhesive layer 63, the fourth retardation film 52, the third retardation film 51, the fourth adhesive layer 64 and the flexible display panel 1, which are sequentially disposed from top to bottom.

Figure 4:
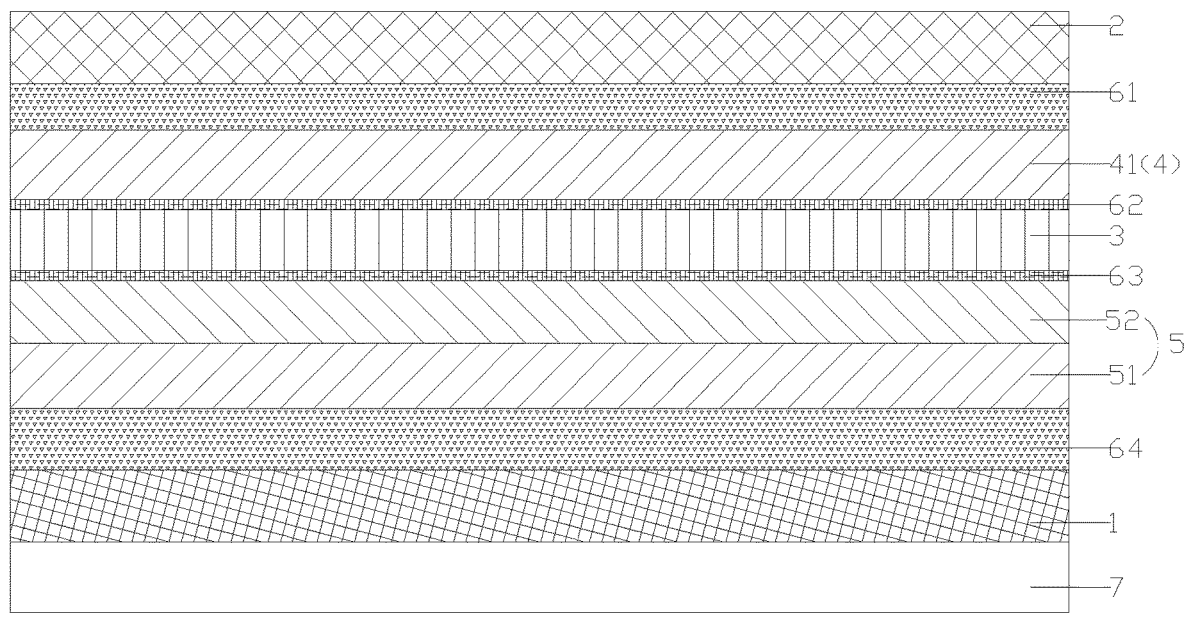
FIG. 4 is a schematic cross-sectional view of a flexible touch display module according to an embodiment of the present disclosure.

In a fourth example, as shown in FIG. 4, the flexible touch display module 100 includes the flexible cover plate 2, the first adhesive layer 61, the first retardation film 41, the second adhesive layer 62, the linear polarization layer 3, the third adhesive layer 63, the fourth retardation film 52, the third retardation film 51, the fourth adhesive layer 64 and the flexible display panel 1, which are sequentially disposed from top to bottom.

In conclusion, the flexible touch display module 100 according to any one of the above examples of the present disclosure has a relatively small thickness, good flexibility, low cost of material, better tensile resistance property, a sunglassfree function, and good display and anti-reflection functions. A type of the flexible display panel 1 is not limited, and may be, for example, an OLED display panel. In addition, in some implementations, the flexible touch display module 100 according to the embodiment of the present disclosure may further include a back support member 7 disposed on a side of the flexible display panel 1 away from the flexible cover plate 2 as desired, that is, the flexible touch display module includes the back support member 7 disposed on the non-display side of the flexible display panel 1, so as to achieve a support effect on the back of the flexible display panel 1.

The touch display device 1000 according to an embodiment of the present disclosure in a second aspect is described below.

Figure 5:
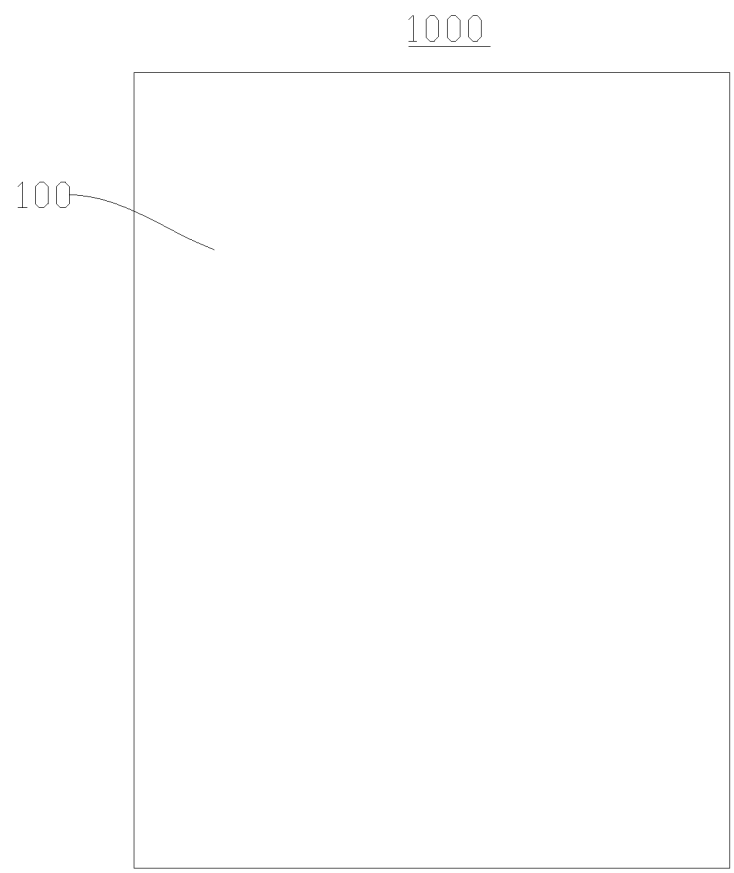
FIG. 5 is a schematic view of a touch display device according to an embodiment of the present disclosure.

As shown in FIG. 5, the touch display device 1000 according to the embodiment of the present disclosure may include the flexible touch display module 100 according to the embodiment of the present disclosure in the first aspect. Therefore, the touch display device 1000 has characteristics such as a relatively small thickness, good flexibility, low cost of material, better tensile resistance property and a sunglassfree function. It should be noted that a type of the touch display device 1000 according to the embodiment of the present disclosure is not limited, and may be, for example, a mobile phone, a tablet computer, a smart wearable device, a home decoration including the touch display device 1000, and the like, which is not limited herein. In addition, it should be noted that a size of the flexible touch display module 100 may be designed according to a size of the touch display device 1000.

In an example, the touch display device 1000 including the flexible touch display module 100 may be a mobile phone, which has a screen with a length of about 140 mm and a width of about 70 mm, the mobile phone is capable of being folded along a center line parallel to a short side of the mobile phone, the center line is a folding line, namely, the direction at an angle of about 0° mentioned above, the absorption axis of the linear polarization layer 3 is at an angle of about 90°, the first retardation film 41 is a liquid crystal layer with a quarter-wavelength retardation, and an included angle between the direction in which the minor axis of the first retardation film 41 extends and the absorption axis of the linear polarization layer 3 is about 45°Therefore, the touch display device 1000 has characteristics such as a relatively small thickness, good flexibility, low cost of material and better tensile resistance property.

Other configurations and operations of the touch display device 1000 according to the embodiment of the present disclosure are known to those skilled in the art, and will not be described in detail herein.

In the description of the present disclosure, the description of reference terms such as "an embodiment", "some implementations", "an example", "some examples" or the like means that particular features, structures, materials, or characteristics described in connection with the embodiment, example or implementation is included in at least one embodiment, example or implementation of the present disclosure. In this specification, schematic representations of the above-mentioned terms are not necessarily intended to refer to the same embodiment, example or implementation. Furthermore, the particular features, structures, materials, or characteristics described may be combined in any suitable manner in any one or more embodiments, examples or implementations. Moreover, various embodiments or examples and features of various embodiments or examples described in this specification may be conjoined and combined by those of ordinary skill in the art without contradiction.

While the embodiments of the present disclosure have been shown and described, it will be understood by those of ordinary skill in the art that, various changes, modifications, substitutions and alterations may be made to the embodiments without departing from the principle and spirit of the present disclosure, and the scope of the present disclosure is defined by claims and their equivalents.

The invention claimed is:

1. A flexible touch display module, comprising:
a flexible display panel;
a flexible cover plate disposed on a display side of the flexible display panel;
a linear polarization layer disposed between the flexible display panel and the flexible cover plate, and an absorption axis of the linear polarization layer is at an angle of about 90°;
a first retardation plate disposed between the linear polarization layer and the flexible cover plate, the first retardation plate comprising a first retardation film, the first retardation film being a liquid crystal layer with a quarter-wavelength retardation and having a major axis and a minor axis in a plane parallel to the flexible display panel, wherein an included angle between a direction in which the minor axis of the first retardation film extends and the absorption axis of the linear polarization layer is about 45°; and
a second retardation plate disposed between the linear polarization layer and the flexible display panel.

2. The flexible touch display module of claim 1, wherein the flexible cover plate is of a single-layer or multi-layer structure, and a material of the flexible cover plate comprises one or a combination of two or more of polyimide, polyethylene terephthalate, polycarbonate, polyarylester, polyethersulfone, polyethylene naphthalate, fiber reinforced plastic, ultrathin glass, or polydodecyl methacrylate.

3. The flexible touch display module of claim 1, wherein the linear polarization layer comprises at least one of an iodine-based polarizing film and a dye-based polarizing film.

4. The flexible touch display module of claim 1, wherein the first retardation plate further comprises a second retardation film disposed between the first retardation film and the linear polarization layer, the second retardation film is a liquid crystal layer with a half-wavelength retardation and has a major axis and a minor axis in a plane parallel to the flexible display panel.

5. The flexible touch display module of claim 1, wherein the second retardation plate comprises a third retardation film, the third retardation film is a liquid crystal layer with a quarter-wavelength retardation, and the third retardation film has a major axis and a minor axis in a plane parallel to the flexible display panel.

6. The flexible touch display module of claim 5, wherein the second retardation plate further comprises a fourth retardation film disposed between the third retardation film and the linear polarization layer, the fourth retardation film is a liquid crystal layer with a half-wavelength retardation, and the fourth retardation film has a major axis and a minor axis in a plane parallel to the flexible display panel.

7. The flexible touch display module according to claim 6, wherein an included angle between a direction in which the the minor axis of the fourth retardation film extends and the absorption axis of the linear polarization layer is a1, and a1=15°±5°, and an included angle between a direction in which the minor axis of the third retardation film extends and the absorption axis of the linear polarization layer is a2, and a2=2a1+45°.

8. The flexible touch display module of claim 1, wherein the first retardation plate is bonded to the flexible cover plate, and/or the first retardation plate is bonded to the linear polarization layer.

9. The flexible touch display module of claim 1, wherein the second retardation film is bonded to the flexible display panel, and/or the second retardation film is bonded to the linear polarization layer.

10. The flexible touch display module of claim 5, comprising the flexible cover plate, a first adhesive layer, the first retardation film, a second adhesive layer, the linear polarization layer, a third adhesive layer, the third retardation film, a fourth adhesive layer and the flexible display panel, which are sequentially disposed from the display side to an non-display side.

11. The flexible touch display module of claim 6, comprising the flexible cover plate, a first adhesive layer, the first retardation film, a second adhesive layer, the linear polarization layer, a third adhesive layer, the fourth retardation film, the third retardation film, a fourth adhesive layer and the flexible display panel, which are sequentially disposed from the display side to an non-display side.

12. A touch display device, comprising the flexible touch display module of claim 1.

13. The flexible touch display module of claim 2, wherein the linear polarization layer comprises at least one of an iodine-based polarizing film and a dye-based polarizing film.

14. The flexible touch display module of claim 2, wherein the first retardation plate further comprises a second retardation film disposed between the first retardation film and the linear polarization layer, the second retardation film is a liquid crystal layer with a half-wavelength retardation and has a major axis and a minor axis in a plane parallel to the flexible display panel.

15. The flexible touch display module of claim 3, wherein the first retardation plate further comprises a second retardation film disposed between the first retardation film and the linear polarization layer, the second retardation film is a liquid crystal layer with a half-wavelength retardation and has a major axis and a minor axis in a plane parallel to the flexible display panel.

16. The flexible touch display module of claim 13, wherein the first retardation plate further comprises a second retardation film disposed between the first retardation film and the linear polarization layer, the second retardation film is a liquid crystal layer with a half-wavelength retardation and has a major axis and a minor axis in a plane parallel to the flexible display panel.

17. The flexible touch display module of claim 2, wherein the second retardation plate comprises a third retardation film, the third retardation film is a liquid crystal layer with a quarter-wavelength retardation, and the third retardation film has a major axis and a minor axis in a plane parallel to the flexible display panel.

18. The flexible touch display module of claim 3, wherein the second retardation plate comprises a third retardation film, the third retardation film is a liquid crystal layer with a quarter-wavelength retardation, and the third retardation film has a major axis and a minor axis in a plane parallel to the flexible display panel.

19. The flexible touch display module of claim 4, wherein the second retardation plate comprises a third retardation film, the third retardation film is a liquid crystal layer with a quarter-wavelength retardation, and the third retardation film has a major axis and a minor axis in a plane parallel to the flexible display panel.

20. The flexible touch display module of claim 13, wherein the second retardation plate comprises a third retardation film, the third retardation film is a liquid crystal layer with a quarter-wavelength retardation, and the third retardation film has a major axis and a minor axis in a plane parallel to the flexible display panel.

* * * * *